United States Patent [19]

Dholakia et al.

[11] Patent Number: 4,797,728

[45] Date of Patent: Jan. 10, 1989

[54] SEMICONDUCTOR DEVICE ASSEMBLY AND METHOD OF MAKING SAME

[75] Inventors: Anil R. Dholakia, Cranbury Township, Middlesex County; Louis Trager, Raritan Township, Somerset County, both of N.J.

[73] Assignee: General Electric Company, Schenectady, N.Y.

[21] Appl. No.: 886,077

[22] Filed: Jul. 16, 1986

[51] Int. Cl.$^4$ .............................................. H01L 23/02
[52] U.S. Cl. ........................................ 357/81; 357/74
[58] Field of Search ......................... 357/81, 81 C, 74

[56] References Cited

U.S. PATENT DOCUMENTS

| | | | |
|---|---|---|---|
| 4,240,090 | 12/1980 | Hughes et al. | 357/81 |
| 4,240,098 | 12/1980 | Zory et al. | 357/81 |
| 4,394,679 | 7/1983 | Hawrylo | 357/81 |

FOREIGN PATENT DOCUMENTS 59-14654  1/1984  Japan ...................................... 357/81

*Primary Examiner*—Martin H. Edlow
*Assistant Examiner*—Gregory A. Key
*Attorney, Agent, or Firm*—Harvey R. Ball; James C. Davis, Jr.; Paul R. Webb, II

[57] ABSTRACT

The invention is a semiconductor device assembly and method of making the same. A mounting plate has positioning means for positioning the plate relative to a header, a first mounting surface of the plate is attached to the header and a semiconductor device is attached to a second mounting surface of the mounting plate. The assembly is made by forming the mounting plate, positioning the mounting plate relative to the header by the positioning means, attaching the first mounting surface to the header and the semiconductor device to the second mounting surface. Another method of making the assembly is by defining and etching a mounting plate and attaching the first mounting surface to the header and the semiconductor device to the second mounting surface. This assembly and process provides an efficient means for mounting semiconductor devices and in particular electro-optic devices such as lasers.

4 Claims, 1 Drawing Sheet

SEMICONDUCTOR DEVICE ASSEMBLY AND METHOD OF MAKING SAME

The invention herein described was made in the performance of work under NASA Contract No. NAS 1-17441 and is subject to the provisions of Section 305 of the National Aeronautics and Space Act of 1958 (72 Stat. 435; 42 U.S.C. 2457).

The invention relates to a semiconductor device assembly having a header, a mounting plate attached to the header and a semiconductor device attached to the mounting plate.

BACKGROUND OF THE INVENTION

In mounting semiconductor devices on headers problems may arise in the accuracy of alignment of the semiconductor device relative to the header. In particular, high power semiconductor lasers must be mounted such that the laser's far field radiation pattern is not distorted and, additionally, such that adequate heat dissipation is provided.

A semiconductor laser typically comprises a body having a pair of opposed end faces with at least one emitting end face. The body includes a substrate having a buffer layer thereon, a first cladding layer overlying the buffer layer, an active region overlying the first cladding layer, a second cladding layer overlying the active region and a capping layer overlying the second cladding layer with electrical contacts to the substrate and capping layer. Primarily, heat is generated in the active region which is typically in the shape of a ridge which may be three micrometers ($\mu$m) or less in width in the lateral direction, the direction in both the plane of the layers and the end faces.

When the laser is mounted to a surface of a header, the emitting end face must be coplanar with, or extend past, the leading edge of the header to prevent reflections of the laser light from the surface of the header which would distort the laser's far field radiation pattern. Generally, heat sinking requirements necessitate that the emitting end face extend no greater than 2 $\mu$m past the edge of the suffacce of the header. As a practical matter these tolerances are difficult to meet since the edge of a standard header, viewed microscopically, is rough and thus requires polishing to obtain a smooth perpendicular edge for mounting. This polishing removes the plating finish on the header which necessitates additional plating operations entailing further time and expense.

After the polishing and plating operations, the laser is soldered to the header. Standard semiconductor device soldering methods are undesirable since these methods place the device in the middle of molten solder and thereby displace solder around the edges of the device. The surrounding solder typically shorts various semiconductor layers, since a high power laser is typically mounted such that the electrical contact opposite the substrate is soldered to the header ad the semiconductor layers are of minimal thickness. Consequently, the surface of the header is typically wetted with a thin layer of indium solder and then the laser is gradually positioned on the surface so that the emitting end face is coplanar with the leading edge of the header surface.

These problems demonstrate that it would be desirable to have an economical and efficient method for mounting semiconductor devices on headers.

SUMMARY OF THE INVENTION

The invention is a semiconductor device assembly which comprises a header and a mounting plate having means for positioning the mounting plate relative to the header with a first mounting surface of the plate attached to the header and a second mounting surface of the plate having a semiconductor device attached thereto.

The assembly is made by forming the mounting plate, positioning the mounting plate relative to the header attaching the first mounting surface of the plate to the header, and attaching the semiconductor device to the second mounting surface of the plate.

A second method of making the assembly is by defining and etching a mounting plate and attaching a first mounting surface of the plate to a header and attaching the semiconductor device to a second mounting surface of the plate.

DETAILED DESCRIPTION OF THE PREFERRED EMBODIMENTS

Figure 1:
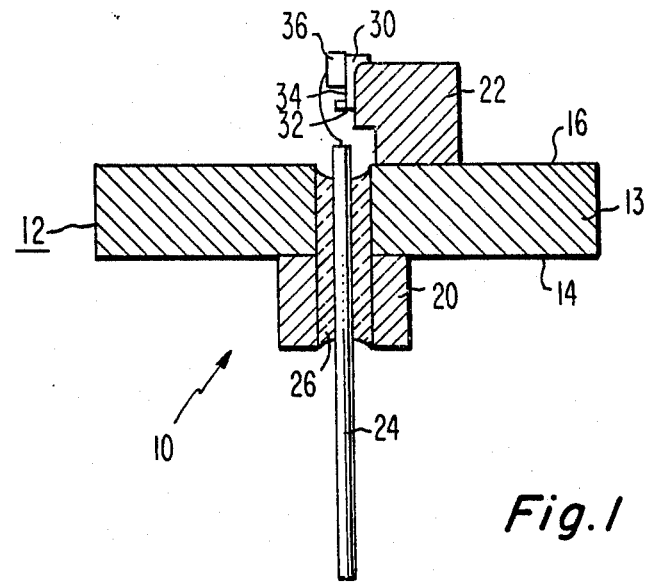
FIG. 1 is a cross-sectional view of the semiconductor device assembly of the invention.

In FIG. 1 a semiconductor device assembly 10 incorporating the invention includes a header 12 which comprises a base plate 13 with first and second major surfaces 14 and 16, respectively. A stud 20 is attached to the first major surface 14, and a mounting block 22 is attached to the second major surface 16. A lead 24 extends through and is electrically isolated from the base plate 13 and the stud 20 by an insulating material 26. A mounting plate 30 has a first major mounting surface 32 attached to the mounting block 22 and a second major mounting surface 34 to which a semiconductor device 36 is attached.

The base plate 13, stud 20 and mounting block 22 are typically formed of an electrically conducting material such as copper with the stud 20 and mounting block 22 attached to the baseplate 13 by brazing. The insulating material 26, such as plastic encapsulant or glass, is inserted to support the lead 24 and provide electrical isolation from the baseplate 13 and the stud 20. Generally, the semiconductor device 36 is an electro-optic device such as a semiconductor injection laser.

Figure 2:
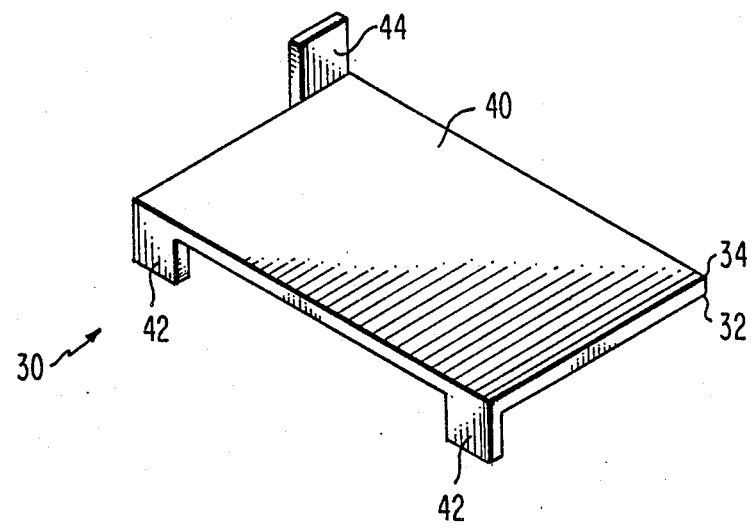
FIG. 2 is a perspective view of a mounting plate of the invention.

In FIG. 2 the mounting plate 30 comprises a platform 40 having a means 42 for positioning the plate 30 relative to the mounting block 22 and a means 44 for handling the plate 30. The positioning means 42 is preferably a pair of tabs extending from an edge of the plate 30 in a direction perpendicular to the first and second mounting surfaces 32 and 34, respectively. The handling means 44 is typically a tab extending from an edge of the plate 30 in a direction opposite to the direction of the positioning means 42.

The plate 30 is formed of an electrically conducting material such as beryllium-copper, silver or, typically, a copper sheet. The platform 40 is typically about 250 $\mu$m or less in thickness and preferably between about 25 and 125 $\mu$m in thickness. When the platform 40 is of minimal thickness the heat will primarily be transferred directly through the plate 30 to the mounting block 22, having minimal heat dissipation throughout the plate 30. Alternatively, if the plate 30 is of sufficient thickness heat will be transferred throughout the plate 30, thus providing a larger surface area resulting in greater heat flow to the mounting block 22 which is the primary heat sink. With the addition of the plate 30, this greater heat flow is desirable since the heat must then pass through two solder junctions which exist between the device 36 and the plate 30 and between the plate 30 and the mounting block 22. These solder junctions do not conduct heat as readily as the mounting plate 30 and the mounting block 22, and consequently provide less heat dissipation for the assembly 10. Thus, platforms 40 which are at least about 25 $\mu$m thick are desirable to provide dissipation throughout the plate, although with platforms 40 greater than 250 $\mu$m thick it is difficult to obtain sharp edges on the plate 30 when they are microlithographically defined.

The plate 30 is formed in a sheet of suitable material using standard processing techniques such as photolithography and etching techniques such as ion-beam milling and similar processes. Typically, a photoresist is applied, exposed, developed and the sheet is subsequently etched with a solution such as ferric chloride. These techniques, unlike the prior art, form a sharp edge for mounting the device 36. For example, leading edges of accurately machined headers typically have an appoximately 12 $\mu$m radius, thus making alignment of the emitting end face within 2 $\mu$m of the leading edge of the header difficult. Additionally, even accurate machining typically leaves burrs extending about 5 $\mu$m from the surface of the header. Consequently, approximately 5 $\mu$m thick solder must therefore be interposed between the device and the header, although a maximum of 1 to 2 $\mu$m of solder is desirable for heat dissipation. Further, machining processes typically use aluminum-oxide or silicon-carbide polishing grits which leave particles embedded in the surface which inhibit uniform plating or soldering. In contrast, the present process produces plates having a leading edge with an approximately 2 $\mu$m radius, thus making alignment of the emitting end face with the leading edge of the plate practical. The plate is also free of detectible burrs and particles embedded in the surface. Additionally, the plates formed by this process may be produced in quantity at the same time with relatively consistent characteristics, while with a machining process the plates are formed sequentially with varying quality.

Generally the plate 30 is formed such that the length and width of the second mounting surface 34 is between about 1.5 to 3.0 times the size of the respective length and width of the semiconductor device 36. For example, a laser is typically about 200 $\mu$m in width and 300 $\mu$m in length, thus the plate 30 is typically between about 300 and 600 $\mu$m in width, and 450 and 900 $\mu$m in length. Although different sizes and geometries of plates may be formed for various heat sinking requirements and different shapes of headers, typically a single plate 30 geometry may be used for a variety of semiconductor devices and headers. The plates are then bent to form the positioning means 42 and the handling means 44. The plates are then plated with about 2.0 $\mu$m of nickel and between about 1.0 to 2.0 $\mu$m of tin and then subsequently separated from one another.

The plate 30 is positioned on the mounting block 22 by mechanically grasping the handling means 44. The positioning means 42 aids in orienting the plate 30 relative to a leading edge of the mounting block 22. A leading edge being a surface connecting the first and second major mounting surfaces 32 and 34, respectively. A die attacher then positions the device 36 such that an end face is positioned substantially coplanar with a leading edge of the plate 30, which is to include the end face of the device 36 extending over an edge of the plate 30 by about 2 $\mu$m. The first mounting surface 32 is attached to the mounting block 22 and simultaneously the device 36 is attached to the second mounting surface 34 by heating the plate 30 to about 300° C. such as by a strip heater. Alternatively, the plate 30 may be first attached to the mounting block 22 or the device 36 may be first attached to the plate. A bond wire is then electrically connected from the lead 24 to the semiconductor device 36.

The sharply defined edges of the plate 30 eliminate the requirement of well-defined edges on the mounting block 22, thus eliminating the necessity for additional polishing and plating operations. Further, since a desired plating thickness has been formed on the plate 30 for the simultaneous soldering operation, previous techniques which were time consuming and additionally which may short layers of the semiconductor device 36 are eliminated.

We claim:

1. A semiconductor device assembly comprising:
   a header;
   a mounting plate composed of an electrically conductive material about 250 micrometers or less in thickness having opposed first and second major mounting surfaces and a leading edge surface extending therebetween with a first mounting surface attached to said header;
   a means for positioning said mounting plate relative to said header attached to said mounting plate; and
   a semiconductor device having an end face attached to said second mounting surface wherein said end face is substantially coplanar with said leading edge surface.

2. The assembly of claim 1, wherein said means for positioning comprises at least one tab extending from an edge of said plate in a direction about perpendicular to said first mounting surface.

3. The assembly of claim 1, wherein said mounting plate is plated with nickel and tin.

4. The assembly of claim 1, wherein said semiconductor device is an electro-optic device.

* * * * *